US007095006B2

(12) United States Patent
Yang

(10) Patent No.: US 7,095,006 B2
(45) Date of Patent: Aug. 22, 2006

(54) PHOTODETECTOR WITH HETERO-STRUCTURE USING LATERAL GROWTH

(75) Inventor: Min Yang, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 245 days.

(21) Appl. No.: 10/737,038

(22) Filed: Dec. 16, 2003

(65) Prior Publication Data

US 2005/0127275 A1    Jun. 16, 2005

(51) Int. Cl.
*G01J 1/44* (2006.01)
*H01L 31/075* (2006.01)

(52) U.S. Cl. .................. 250/214 R; 257/458
(58) Field of Classification Search ............. 257/184, 257/185, 188, 443, 183, 186, 190, 458; 250/214 R
See application file for complete search history.

(56) References Cited

U.S. PATENT DOCUMENTS 5,994,724 A    11/1999  Morikawa ............. 257/184
6,043,517 A    3/2000   Presting ................ 257/184
6,451,702 B1   9/2002   Yang .................... 438/706
6,459,107 B1   10/2002  Sugiyama .............. 257/226
2002/0058388 A1*  5/2002  Ryum et al. .......... 438/364
2005/0093021 A1*  5/2005  Ouyang et al. ....... 257/194

OTHER PUBLICATIONS

"Avalanche Gain in $Ge_xSi_{1-x}$/Si Infrared Waveguide Detectors" Pearsall et al, IEEE Electron Device Letters, vol. EDL-7, No. 5., pp. 330-332, (1986).

* cited by examiner

*Primary Examiner*—Georgia Epps
*Assistant Examiner*—Don Williams
(74) *Attorney, Agent, or Firm*—George Sai-Halasz

(57) ABSTRACT

A structure and method of fabrication for a Si based material p-i-n photodetector is disclosed. The light is absorbed in an undoped layer containing SiGe or Ge in such a manner that the absorption length is not limited by a critical thickness of the SiGe or Ge layer. The result is achieved by growing the SiGe or Ge layer from the walls of a trench in monocrystalline Si using lateral epitaxial. A second, doped material is disposed over the undoped layer for biasing and photocarrier collection in the p-i-n diode.

13 Claims, 6 Drawing Sheets

PHOTODETECTOR WITH HETERO-STRUCTURE USING LATERAL GROWTH

FIELD OF THE INVENTION

The present invention generally relates to optical detectors, and more particularly to lateral trench optical detectors formed in a Si based material framework.

BACKGROUND OF THE INVENTION

In many advance applications there is a need to combine microelectronics with optical technologies. One cornerstone device in optical technologies is the photodetector, a device which converts a light signal into an electrical signal. The material ruling microelectronics is silicon (Si). However its optical applications are limited by its small light absorption coefficient due to its indirect band structure. Moreover the cut-off wavelength in silicon is about 1.1 µm corresponding to its band-gap of 1.12 eV at room temperature. To extend the light absorption to infrared regime, especially to 1.3 or 1.55 µm for medium or long distance communication, and/or increase light absorption, germanium (Ge) is usually introduced into silicon in the absorption region (for example, intrinsic region in a p-i-n photodiode) because it has smaller band-gap and larger absorption coefficient. It is also relatively compatible with silicon, capable of forming a good quality single crystal of $Si_{1-x}Ge_x$, where "x" is a number greater than 0 and less or equal to 1 ($0 \leq x \leq 1$) giving the fractional concentration of Ge. The p-i-n diode, meaning an intrinsic semiconductor layer, the "i" in the p-i-n, is disposed between two conductive semiconductors of opposite conductivity type, the "p" and the "n". The higher the Ge concentration in the $Si_{1-x}Ge_x$ alloy, the larger the light absorption coefficient at certain wavelength and the longer the cut-off wavelength will be. To an extreme, the entire intrinsic region of the p-i-n photodiode can be pure Ge. However due to the lattice mismatch between Si and Ge, to achieve defect-free quality the thickness of the $Si_{1-x}Ge_x$ alloy layer grown on silicon substrate is limited by the Ge concentration, i.e. the higher the Ge content the thinner the $Si_{1-x}Ge_x$ layer must be. For each Ge concentration in the SiGe there is a well defined thickness, called the critical thickness, beyond which the SiGe relaxes its strain in the form of lattice defects. Defects in the intrinsic (light absorption) region can dramatically increase the photodetector dark current and thus reduce the signal-to-noise ratio. Currently a Si based photodetector working in the 1.3 or 1.55 µm requires a Ge concentration >70% in the light absorption region, which limit the thickness of defect-free $Si_{1-x}Ge_x$<10 nm. For such a thin $Si_{1-x}Ge_x$ layer, the total light absorbed, and thus the sensitivity of the photodetector is very low. For application in shorter wavelength (for example 850 nm), although higher Ge content give larger light absorption coefficient compared with Si, the limited $Si_{1-x}Ge_x$ thickness will limit the benefit of adding Ge. Therefore a need exists for a structure/method for forming p-i-n diode using high quality $Si_{1-x}Ge_x$ layer with large Ge concentration and large sensitivity.

SUMMARY OF THE INVENTION

For a conventional p-i-n photodiode with vertical stacks formed by ion implantation or epitaxial growth, the light absorption depth is the SiGe layer thickness in the epitaxial growth direction.

The present invention describes a structure and method based on the lateral trench photodetector that enables high Ge concentration with deep light absorption depth. The lateral trench photodetector structure has advantages in that the lateral field is very large compared with a surface lateral p-i-n diode, enabling high speed, fast response and low supply voltage. See for instance, U.S. Pat. No. 6,451,702 entitled: "Methods for forming lateral trench optical detectors" to M. Yang and K. Rim, incorporated herein by reference. In such a photodetector the light is incident from the top of the devices, and the electric field is in the lateral direction, transporting photocarriers laterally.

According to the present invention, a SiGe or Ge layer is introduced in the intrinsic region of a lateral trench detector, in such a manner that the depth of the absorption is not limited by the critical thickness of the $Si_{1-x}Ge_x$ layer. This is achieved by using lateral epitaxial growth of the SiGe from the walls of a trench. The resulting photodetector by allowing an almost arbitrarily long photon absorption path in a high crystalline quality SiGe material, will have greatly improved capabilities in comparison to photodevices now in existence.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
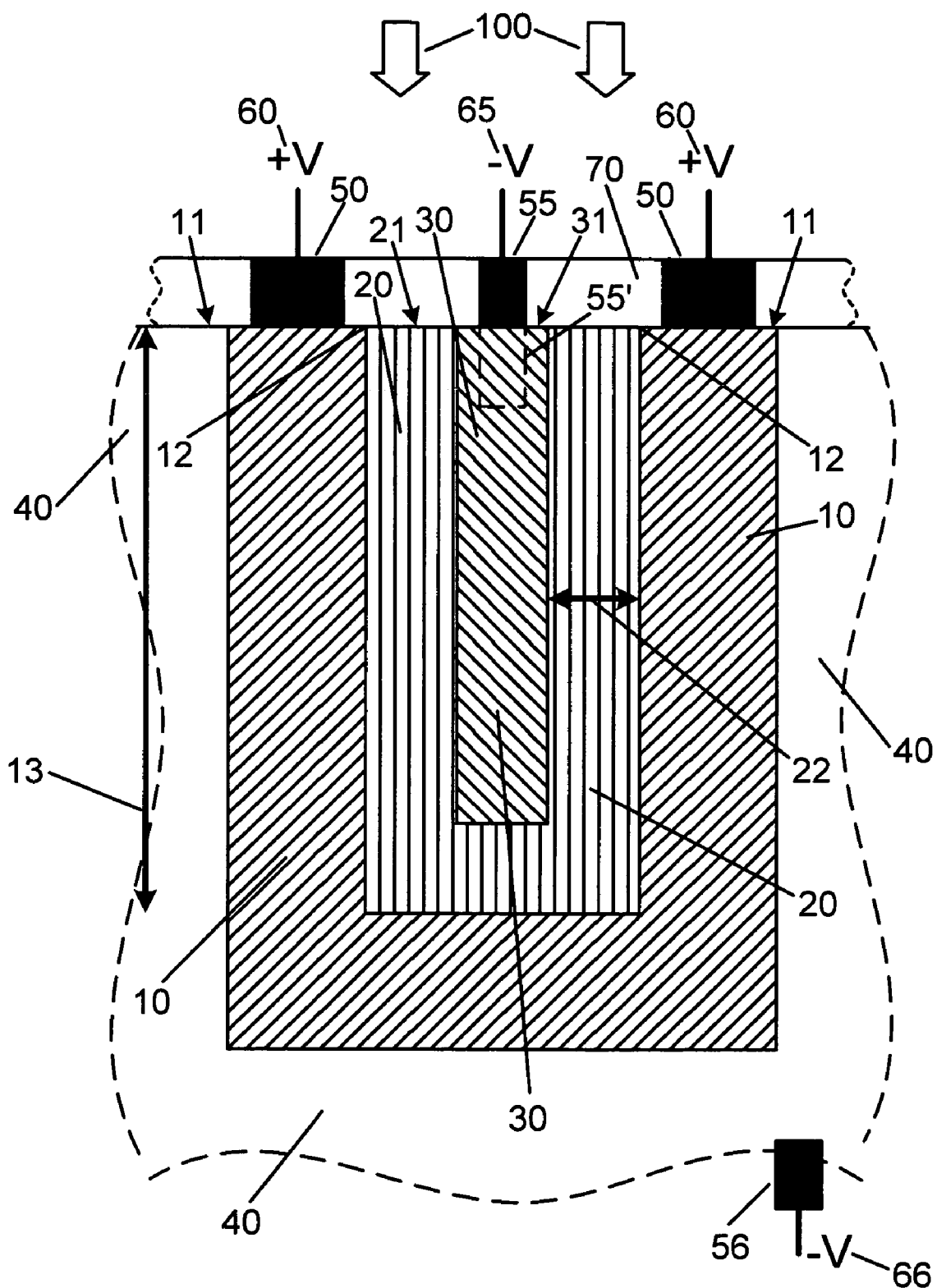
FIG. 1 schematically shows in cross section an exemplary embodiment of a heterojunction photodetector.

FIG. 1 schematically shows in cross section an exemplary embodiment of a heterojunction photodetector. A silicon (Si) body 40, typically with dimensions larger than the photodetector, (hence only a dotted outline is shown on FIG. 1), contains a Si well 10. The body 40 and well 10 are of the same material. The distinction, when there is any, between the two is in their doping. The well is heavily doped, to a first doping level, in the range of $>10^{18}/cm^3$, while the body usually has at least an order of magnitude lower doping, typically $<10^{17}/cm^3$. Both the body and the well are single crystal, or monocrystalline Si. In a representative embodiment the body is a Si wafer, such as customarily found in the microelectronics art.

Figure 2A:
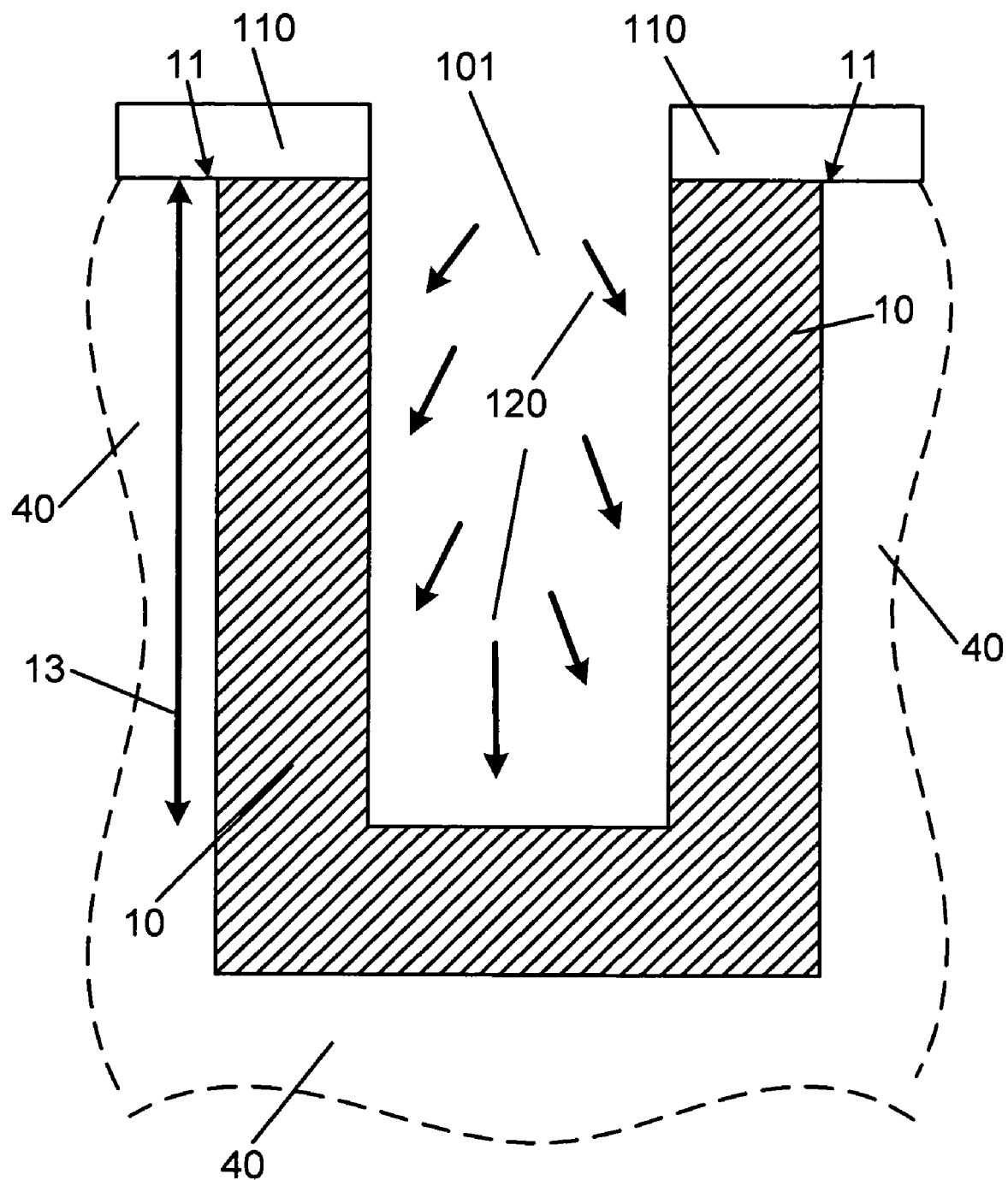
FIG. 2 schematically shows fabrication steps for an exemplary embodiment of a heterojunction photodetector.

The well 10 has a first doping level and a first conductivity type. In exemplary embodiments the first conductivity type can be either n-type or p-type. The well 10 has a surface plane 11, which is essentially the plane of the body. Contained in the well and extending downward from the surface plane there is a trench, shown in an empty state 101 on FIG. 2A. Where the trench reaches the surface it forms a perimeter 12. This perimeter 12 resides in the surface plane 11 of the well. The cross sectional shape of the well 10, and consequently the shape of the perimeter 12, can be of many variety. Typically such shapes are rectangular or circular, but other shapes are suitable as well. The trench is lined with an undoped layer 20. This undoped liner layer 20 is also a single crystal material, and it is in an epitaxial relation with the well. The terms "epitaxial relation", "epitaxially", "epitaxy", "epi" etc. carry their customary usage: meaning the single crystal lattice structure carries across an interface. Typically, a monocrystalline material, in the present case the well 10, forms a platform onto which another single crystal material, the undoped liner layer 20, with matching crystalline characteristics is deposited by one of several techniques known in the art. Such techniques are, for instance, molecular beam epitaxy (MBE), or various types of chemical vapor depositions (CVD). In the present invention the undoped layer 20 is grown by so called lateral epitaxy. This means that layer 20 begins its growth on the sidewalls, and also on the bottom, of the well 10. Since the depth 13 of the trench 101 is larger than a characteristic measure, such as a diameter, a diagonal, etc., of its cross section, the growth of the undoped epi is filling the well from the sides toward the center. Since FIG. 1 shows an already finished structure, the undoped layer 20 is also shown in its completed form. Since it covers the walls of the well essentially in a uniform manner, it is termed as liner. Although the exact angle of the trench walls with respect to the surface plane 11 is not critical, it is generally preferred for the sidewalls be nearly perpendicular to the surface plane 11.

The undoped liner layer 20 contains a $Si_{1-x}Ge_x$ layer, or as shown in FIG. 1, in representative embodiments the whole of the undoped layer 20 is a $Si_{1-x}Ge_x$ layer. The composition of the $Si_{1-x}Ge_x$ layer is such that "x" can equal 1, namely the layer can be pure Ge, but "x" is never 0, since the invention deals specifically with the effects of the Ge in the photodetector. The lattice constant of $Si_{1-x}Ge_x$ increases with increasing Ge concentration, but it is always larger than that of Si. Accordingly, an epitaxial $Si_{1-x}Ge_x$ layer on Si in under compressive strain. The $Si_{1-x}Ge_x$ layer will maintain its strained state and will remain essentially a defect free single crystal as long as its thickness is below the so called critical thickness. When it reaches the critical thickness the $Si_{1-x}Ge_x$ film relaxes its strain in the form of lattice defects. Since in the present invention the $Si_{1-x}Ge_x$ layer is grown in the side or lateral direction, its thickness is measured accordingly. In FIG. 1 the thickness of the $Si_{1-x}Ge_x$ layer is indicated by arrow 22. In this disclosure the thickness of the $Si_{1-x}Ge_x$ layer refers to this lateral thickness, which is always selected to be below the critical thickness corresponding to that particular $Si_{1-x}Ge_x$ composition. At their interface the $Si_{1-x}Ge_x$ and the Si are forming a heterojunction. The term heterojunction simply means that two different materials are interfacing and abrupt changes in the material and electrical environment can occur at this interface. The name "heterojunction" in the disclosed photodetector is indicative of the $Si/Si_{1-x}Ge_x$ interface.

The light 100 impinging on the photodetector is primarily absorbed in the undoped layer 20, down to a depth which depends on the wavelength. As it is known in the art, for the operation of the photodetector is important that the photon absorbing material be free of defects. It is for this reason that the $Si_{1-x}Ge_x$ layer thickness 22 must stay below the critical thickness, since above such a thickness the layer relaxes and a large number of defects form in the material. As it is also known in the art, the higher the Ge concentration in the $Si_{1-x}Ge_x$ layer the smaller the critical thickness is. On the other hand, the larger the Ge concentration, the smaller the $Si_{1-x}Ge_x$ bandgap, and the longer wavelengths are detectable. In the undoped layer 20 the $Si_{1-x}Ge_x$ layer can be 100% Ge, with x=1 in the composition, for the purpose of reaching farthest into the infrared wavelength region.

On the surface plane 11 the undoped layer 20 forms a band 21 (Corresponding to the cross section of the undoped layer 20) that is bordered by the perimeter 12. During operation of the photodetector, light entering through this band 21 is the one that the photodetector is sensitive to.

For various reasons, such as material quality, or the photodetector electrical properties—depending for instance on the capacitance of the undoped layer—, the undoped layer 20 may also contain epitaxial Si. For instance, it may be useful to grow first a thin Si epitaxial layer on the well sidewalls to improve the surface quality before the $Si_{1-x}Ge_x$ layer is deposited. It can also be a finishing layer after the $Si_{1-x}Ge_x$ growth has stopped, for instance to protect the $Si_{1-x}Ge_x$ layer from dopant penetration due to the subsequent fabrication steps. Such considerations would be clear for someone skilled in the arts of material properties and device operations.

The undoped liner layer 20 has a second material 30 of a second conductivity type disposed over it. This second conductivity type is opposite to the first conductivity type of the Si well. The second material 30 covers the liner layer 20 everywhere with the exception of the cross sectional surface band 21 on the surface plane. One has a variety of choices in choosing the second material 30. The purpose of the second material is to create, together with the Si well, a strong electric field across the undoped layer 20, and to collect the carriers which are created in the undoped layer 20 by the impinging photons 100. Accordingly, the second material should be highly dopable to be a good conductor and one that fits well into the general Si based material technology of microelectronics. The second material 30 can be for instance, epitaxial Si, it can also be polycrystalline or amorphous Si, it can also be selected as polycrystalline or amorphous SiGe, or as polycrystalline or amorphous Ge, or any combination of these materials. In one embodiment the second material 30 is n-type, and comprises SiGe or Ge for speedy hole conduction. In the second material 30 the composition of the SiGe does not have to be the same as the composition of the $Si_{1-x}Ge_x$ in the undoped layer 20, hence as distinction for the SiGe in the second material 30 the fraction indicators of "x" and "1−x" are not used.

In a typical embodiment the second material 30 fully fills up the trench, itself forming a surface 31 aligned with the surface plane 11 and band 21. The second material surface 31 is forming an area which in a representative embodiment is surrounded by the surface band 21. Alternatively, the second material 30 does not necessarily has to fully fill the trench. For instance, to improve conductivity a contact 55 may penetrate deeply into the second material 30, as shown by the dashed outline 55'.

The depth of the trench is indicated by arrow 13. This depth 13 is basically the absorption length of the photodetector, being the longest extension downward of the undoped layer 20 from the surface plane 11. The depth 13 is always selected to be larger, and preferably significantly larger, than the critical thickness of the $Si_{1-x}Ge_x$ layer in the undoped layer 20. By growing the $Si_{1-x}Ge_x$ layer from a sidewall, instead of from a surface parallel with the surface plane, the direction of light penetration and $Si_{1-x}Ge_x$ layer thickness direction become substantially perpendicular to one another. In this manner while the light impinges a surface plane 11, it penetrates the $Si_{1-x}Ge_x$ layer "edge wise" without constraints imposed on the absorption length by the $Si_{1-x}Ge_x$ layer critical thickness.

Electrical contact 50 to the Si well and electrical contact 55 to the second material serve in the electrical operation of the photodetector. The contacts are used for reverse biasing the Si well 10 with respect to the second material 30. The +V 60 and −V 65 voltage designations on FIG. 1 are meant to indicate a reverse bias, not absolute voltages relative to a ground. The biasing schemes in photodetector operations are known to practitioners skilled in the art. In general, if the Si well is n-type then the second material is p-type and the voltage on the Si well during device operation is positive relative to the second material. If the Si well is p-type then the second material is n-type and the voltage on the Si well during device operation is negative relative to the second material.

The vertical layout of the reverse biased junction between the Si well 10 and the second material 30 allows for very large electric fields across the undoped layer 20. A strong electric field in the light absorption region 20 allows for fast and efficient photo device operation. On the light sensitive region of the surface of the photodetector one typically disposes a transparent insulator 70 known in the arts, for the purpose of protecting and passivating the semiconductor surface.

Regarding doping of the body 40, one has various choices. In one case the doping type of the body is the same as that of the well, i.e. n-type if the Si well 10 is n-type and p-type if the Si well 10 is p-type. This is a typical embodiment, and the body 40 will have the same potential as the Si well. Alternatively, the body 40 is oppositely doped than the Si-well and the two form a p-n junction, a so called buried junction. In this case, during operation this junction is also reverse biased, and the body 40 will have the polarity as the second material 30. The purpose of a buried junction is to eliminate the effect of photo-generated carriers in the well and body. On FIG. 1. the possibility of an embodiment with a buried junction is indicated with a contact 56 on the body 40, with a −V polarity 66, indicating a reverse polarity relative to the Si well.

Figure 3:
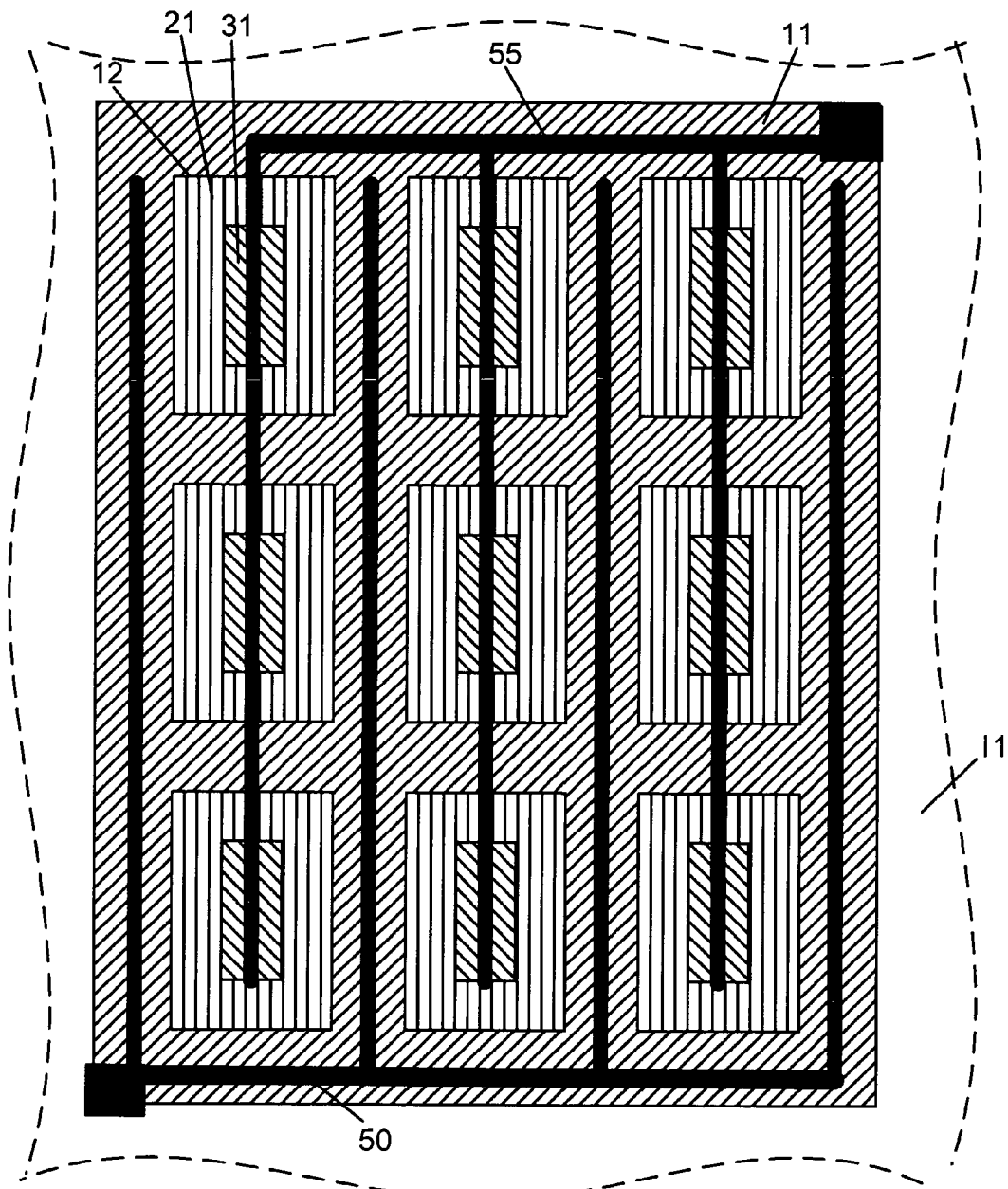
FIG. 3 shows a top view of a photodetector in a representative embodiment.

For simplicity FIG. 1 shows a well hosting a single trench. In representative embodiments the well indeed might contain only a single trench. On the other hand, the well can have a larger extension and host a plurality of trenches. In such a case the contact between the well and the body is primarily from the bottom of the Si-well. FIG. 3 shows the photodetector in a representative embodiment where a single well hosts a plurality of trenches.

In a further representative embodiment the body 40 and the well 10 are not distinct from one another. The body 40 can have the same type and concentration of doping as the Si well 10. This means that the body serves as the well, and the trench is penetrating directly into the body. In such a case the body is typically a wafer, and the wafer serves as the reverse bias potential to the second material 30. In this embodiment the wafer would typically contain a large plurality of trenches.

FIG. 2 schematically shows fabrication steps for an exemplary embodiment of a heterojunction photodetector. FIG. 2A shows the state of the device, when the trench 101 has already been formed. A mask 110 is patterned on the Si body 40 to define the trench location. The mask can contain a single material or combinations of materials, typically in layered forms. Such masks are well known in the art. The trench 101 is fabricated to a desired depth 13 by known methods, such as, for instances reactive ion etching (RIE). Following the trench, the highly doped well 10 is formed by doping 120 the sidewalls, including the bottom of the trenches. The doping 120 results in a first type of conductivity for the well 10, which can be either the same type as the body 40, or of opposite type as the body 40. Methods used to form the highly doped well 10 are known in the art, such as ion implantation, gas phase doping, or drive-in doping from sacrificial silica-glasses, such as ASG and PSG. For the embodiment where there is no separate well but the body takes the role of the well, the whole doping step can be omitted. One can start out instead with an appropriately doped Si wafer to begin with.

Figure 2B:
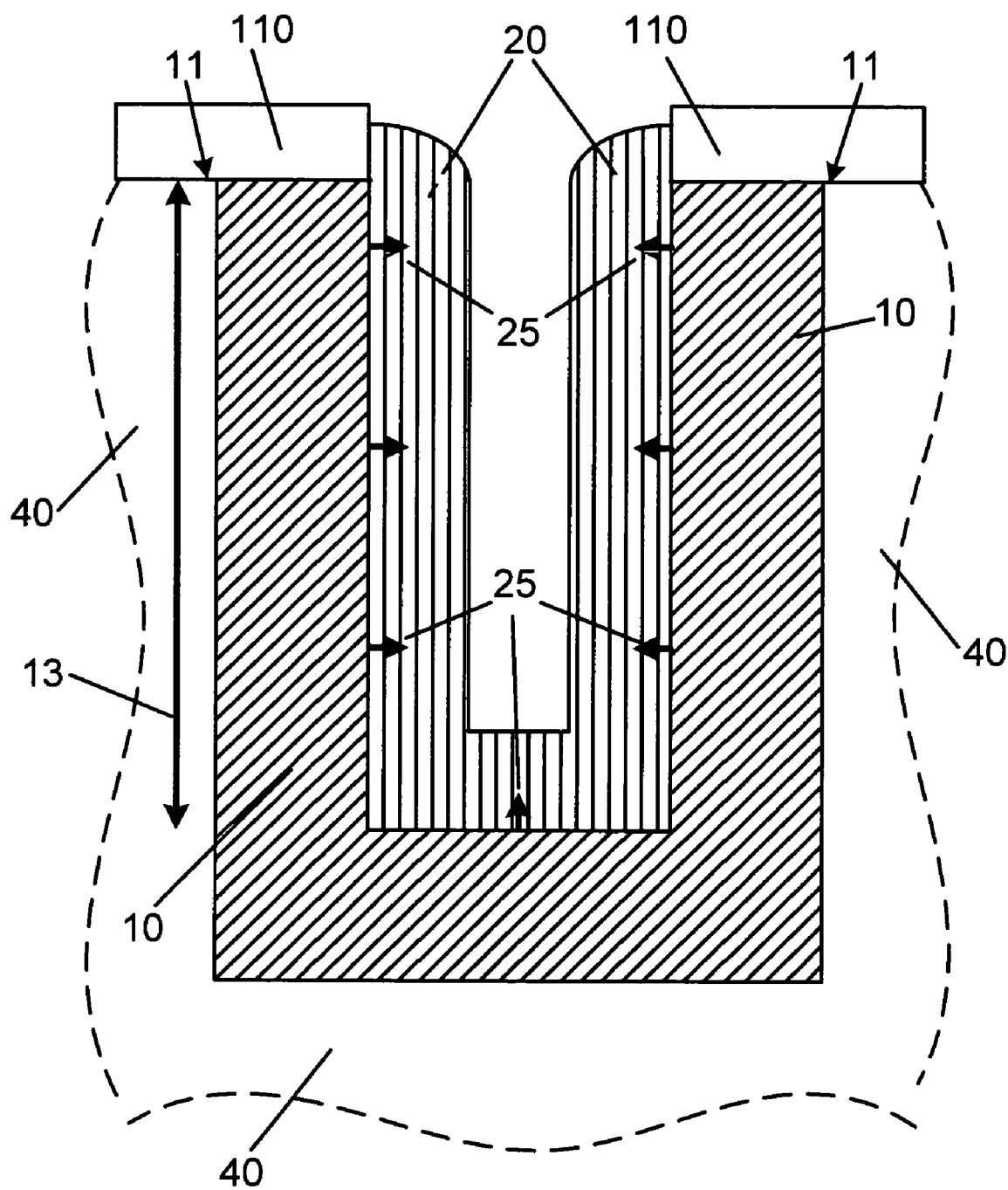

FIG. 2B is a schematic cross sectional view afer the lateral epitaxial growth of the undoped layer 20. The undoped layer 20 in this representative embodiment consists entirely of $Si_{1-x}Ge_x$, but in general there can be a Si layer on either side of the $Si_{1-x}Ge_x$. It is important that the growth proceeds 25 from the trench walls. In this manner the vertical extension of the $Si_{1-x}Ge_x$ layer is not a function of its thickness, which is limited to be below the critical thickness. In the $Si_{1-x}Ge_x$ layer the concentration "x" is widely varied depending on the desired properties of the photodetector, accordingly $0 \leq x \leq 1$. The Ge fraction is never 0, but it can be 1.

Figure 2C:
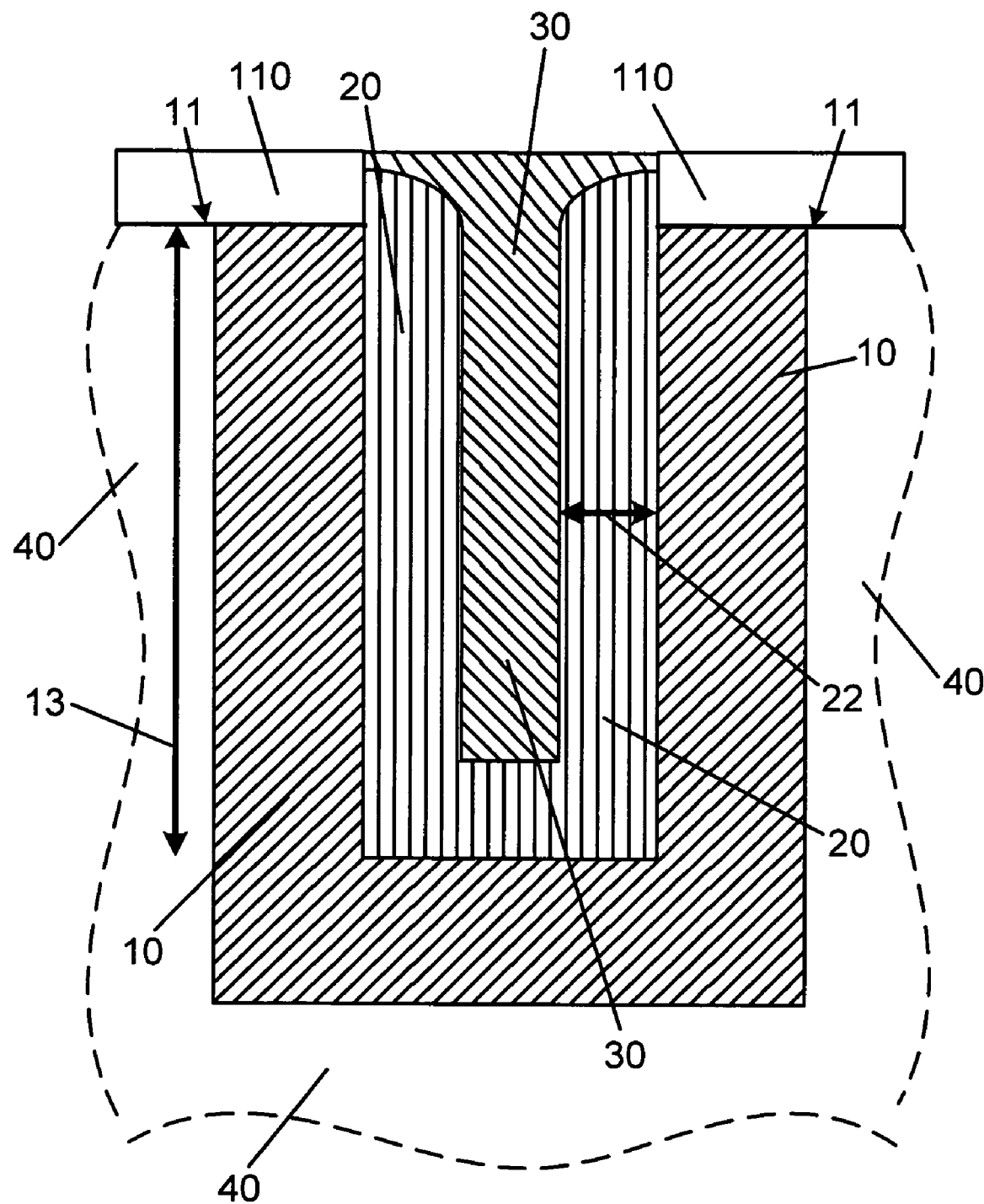

FIG. 2C shows the following step, one in which a highly doped second material 30 is disposed over the undoped layer 20. In a representative embodiment the second material 30 is fully filling up the trench. The second material can be selected to be for instance, epitaxial Si, it can also be polycrystalline or amorphous Si, it can also be selected as polycrystalline or amorphous SiGe, or as polycrystalline or amorphous Ge, or any combination of these materials. If the second material 30 contains SiGe the composition of this SiGe does not have to be the same as the composition of the $Si_{1-x}Ge_x$ in the undoped layer 20, hence as distinction for the SiGe in the second material 30 the fraction indicators "x" and "1−x" are not used. The conductivity type of the second material 30 is chosen to be the opposite of the first conductivity type of the well 10. Just as in the case of the well 10 it is desirable that the second material be as good a conductor as possible. Accordingly the second material is as highly doped as other constraints, such as dopant precipitation, dopant outdiffusion, and further considerations known to those skilled in the art, make it possible.

Figure 2D:
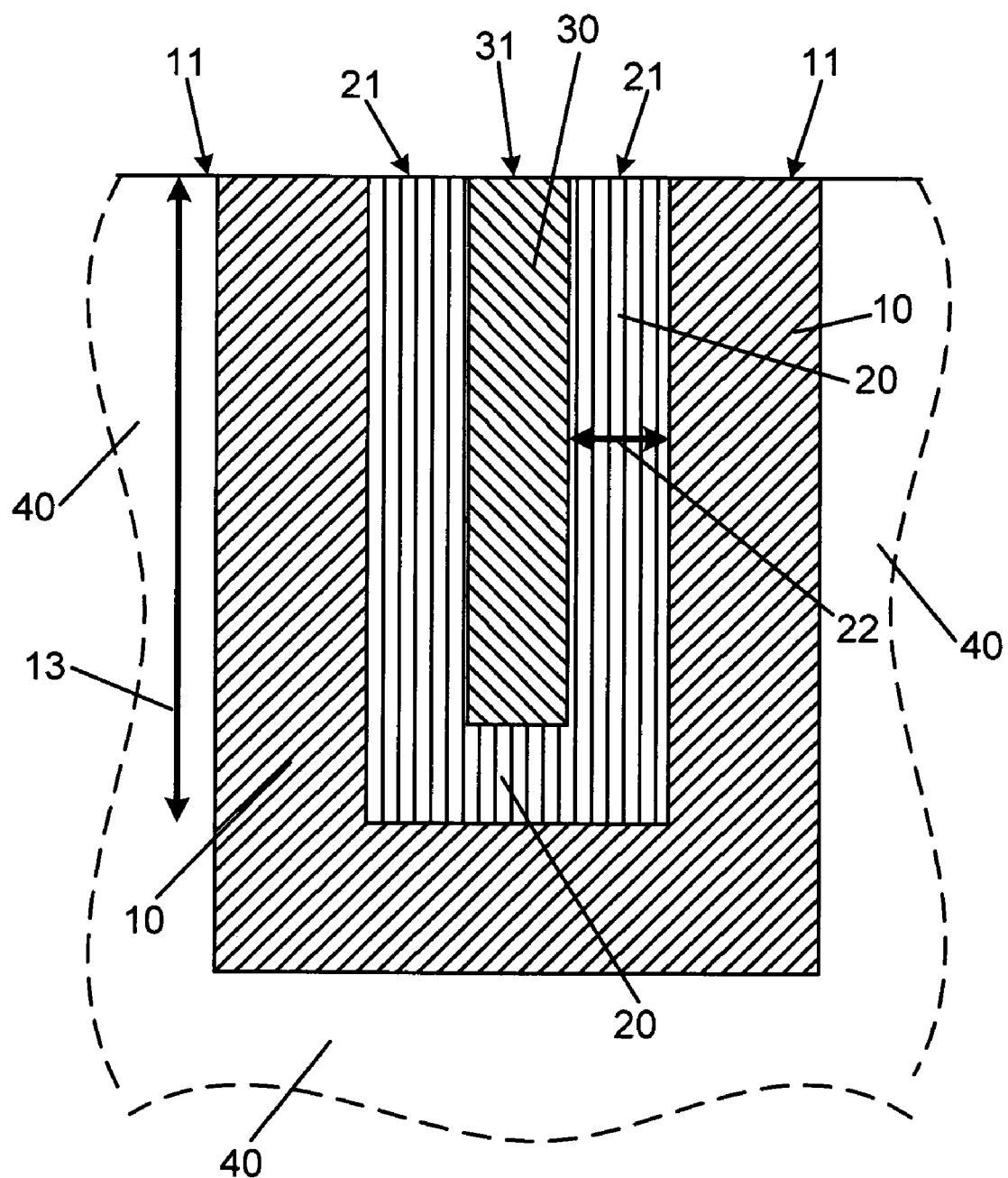

FIG. 2D show the photodetector near its finished state, after all materials above the surface plane 11, including the mask 110, and materials from lateral epitaxy and/or deposition, are polished down, thereby producing a smooth, or planarized, surface. This smooth surface now contains the surface plane 11 of the Si well, the cross sectional surface band 21 of the undoped layer 20 substantially aligned with the surface plane 11, and a cross section of the second material 30 forming a surface area 31.

Following the polishing step, further routine steps—such as depositing transparent protective layers, such as for instance $SiO_2$, and adding contacts,—lead to the completed device as shown in FIG. 1.

FIG. 3 shows a top view of a photodetector in a representative embodiment. The figure being a top view, one observes the surfaces, such as the surface plane 11 of the Si well 10 and the body 40; the band surface 21 aligned with the surface plane 11, which is a cross sectional surface of the undoped layer 20, and its outside border being the trench perimeter 12; and the second material surface 31, forming a surface area inside the undoped band 21. Contacts to the second materials 55 and to the Si-well 50 provide for reverse biasing and for photocurrent detection. The figure showing a case where the well hosts an array of 9 rectangular trenches is for illustrative purposes. In representative embodiments the trenches can have a variety of shapes, such as circular for example, and the number of trenches in the well can vary broadly, from one to a very large plurality. Also, in other representative embodiments the location of the well and the second material can be interchanged, with the well surfacing inside the undoped band 21.

Many modifications and variations of the present invention are possible in light of the above teachings, and could be apparent for those skilled in the art. The scope of the invention is defined by the appended claims.

I claim:

1. A photodetector, comprising:
   a monocrystalline Si well of a first conductivity type, wherein said well has a surface plane, and wherein said well contains at least one trench downwardly extending from said surface plane;
   an undoped epitaxial layer lining said at least one trench, wherein said undoped epitaxial layer comprises a $Si_{1-x}Ge_x$ layer with $0<x\leq1$, wherein said $Si_{1-x}Ge_x$ layer has a thickness which is below a critical thickness, wherein a cross sectional surface of said undoped epitaxial layer forms a band which is substantially aligned with said surface plane; and
   a second material of a second conductivity type disposed over said undoped epitaxial layer but not in contact with said band.

2. The photodetector of claim 1, wherein said at least one trench has a depth which is larger than said critical thickness.

3. The photodetector of claim 1, wherein said at least one trench has a sidewall which is substantially perpendicular to said surface plane.

4. The photodetector of claim 1, wherein said second material substantially fills up said at least one trench.

5. The photodetector of claim 1, wherein said second material is selected from the group consisting of monocrystalline Si in epitaxial relation with said undoped epitaxial layer, polycrystalline Si, amorphous Si, polycrystalline SiGe, amorphous SiGe, polycrystalline Ge, amorphous Ge, and their combinations thereof.

6. The photodetector of claim 1, wherein said $Si_{1-x}Ge_x$ layer is essentially pure Ge.

7. The photodetector of claim 1, wherein said undoped epitaxial layer consists essentially of $Si_{1-x}Ge_x$.

8. The photodetector of claim 1, wherein said first conductivity is p-type and said second conductivity is n-type.

9. The photodetector of claim 1, wherein said first conductivity is n-type and said second conductivity is p-type.

10. The photodetector of claim 1, further comprising a first electrical contact to said Si well and a second electrical contact to said second material.

11. The photodetector of claim 1, wherein said Si well has a first doping level, and wherein said Si well is in contact with a monocrystalline Si body of said first conductivity type, wherein said Si body has a second doping level, and wherein said first doping level is higher than said second doping level.

12. The photodetector of claim 1, wherein said Si well has a first doping level, and wherein said Si well is a monocrystalline Si body.

13. The photodetector of claim 1, wherein said Si well is in contact with a monocrystalline Si body of said second conductivity type.

* * * * *